US005629651A

United States Patent [19]
Mizuno

[11] Patent Number: 5,629,651
[45] Date of Patent: May 13, 1997

[54] PHASE LOCK LOOP HAVING A REDUCED SYNCHRONIZATION TRANSFER PERIOD

[75] Inventor: Masayuki Mizuno, Tokyo, Japan

[73] Assignee: NEC Corporation, Tokyo, Japan

[21] Appl. No.: 510,860

[22] Filed: Aug. 3, 1995

[30] Foreign Application Priority Data

Aug. 12, 1994 [JP] Japan .................................. 6-190452

[51] Int. Cl.$^6$ ............................ H03L 7/095; H03L 7/099
[52] U.S. Cl. ........................ 331/34; 331/57; 331/14; 331/17; 331/DIG. 2; 327/158; 375/376
[58] Field of Search ....................... 331/4, 14, 16, 331/DIG. 2, 57, 34, 17; 327/156, 158, 149, 152, 153, 150, 146, 141; 375/375, 376

[56] References Cited

U.S. PATENT DOCUMENTS

| | | | |
|---|---|---|---|
| 5,173,617 | 12/1992 | Alsup et al. | 327/158 |
| 5,210,509 | 5/1993 | Greef et al. | 331/4 |
| 5,220,294 | 6/1993 | Ichikawa | 331/17 |
| 5,260,979 | 11/1993 | Parker et al. | 331/DIG. 2 X |
| 5,389,898 | 2/1995 | Taketoshi et al. | 331/2 |
| 5,463,337 | 10/1995 | Leonowich | 327/158 |

OTHER PUBLICATIONS

Hideo Sato et al., "A Fast Pull–In PLL IC Using Two–Mode Pull–In Technique", *Electronics and Communications in Japan*, Part 2, vol. 75, No. 3, 1992, pp. 41–51.

Primary Examiner—Robert Pascal
Assistant Examiner—Arnold Kinkead
Attorney, Agent, or Firm—Sughrue, Mion, Zinn, Macpeak & Seas

[57] ABSTRACT

A phase lock loop has a lock detection circuit, a phase comparator, a charge pump circuit, a low-pass filter, a variable delay circuit and a frequency divider. The lock detection circuit generates a lock detection signal when a phase difference between an input reference clock and an output of the variable delay circuit is smaller than a predetermined value in a first stage of the synchronization operation. The input and output of the variable delay circuit are connected in a loop responding to the lock detection signal to form a voltage controlled oscillator (VCO) and shift the phase lock loop into a second stage of the synchronization operation. An initial control signal for controlling the VCO in the second stage is obtained as a value of the variable delay circuit in the first stage before generation of the lock detection signal, thereby obtaining a higher-speed synchronization operation and low jitters in the output clock.

8 Claims, 8 Drawing Sheets

PHASE LOCK LOOP HAVING A REDUCED SYNCHRONIZATION TRANSFER PERIOD

BACKGROUND OF THE INVENTION (a) Field of the Invention

The present invention relates to a phase lock loop and, more particularly, to a phase lock loop having a reduced synchronization transfer period for use as a reference frequency signal source in a microprocessor, a communication system and the like.

(b) Description of the Related Art

A phase lock loop (PLL) is widely used as a generator for a reference frequency signal such as a clock signal in a microprocessor and a local oscillating signal in a communication system and the like.

FIG. 1 shows a first conventional phase lock loop in a block diagram. The first conventional phase lock loop includes a phase comparator 1, a charge pump circuit 2, a low-pass filter 3, a voltage controlled oscillator (VCO) 4 and a frequency divider 5.

Referring to FIG. 2A showing an example of the configuration of the VCO 4, the VCO 4 is implemented by a variable delay circuit 40 including cascaded N variable delay gates D1 to DN, in which each of transmission delays of the delay gates D1 to DN is varied based on the voltage level of the control signal CC. The output of the final stage variable delay gate DN is connected to the input of the first stage variable delay gates D1 to form a loop for oscillation.

Referring to FIG. 2B showing a configuration of one of the variable delay gates; D1 to DN, the variable delay gate is comprised of a CMOS inverter including a PMOS transistor P41 and an NMOS transistor N41, a transistor N42 having a drain connected to the output of the CMOS inverter, a source connected to one of the terminals of a capacitor C41 having the other of the terminals grounded and a gate supplied with the control signal CC, wherein the variable delay gate varies the delay thereof by controlling the load capacitance of the CMOS inverter based on the voltage level of the control signal CC.

Referring back to FIG. 1, in operation, the phase comparator 1 supplies the charge pump circuit 2 with a phase difference signals PDA and PDB based on a phase difference between the external reference clock CKR and the output SD of the frequency divider 5. The charge pump circuit 2 converts the phase difference signals PDA and PDB into an error signal CD, which exhibits a level change proportional to the phase difference between the reference clock CKR and the divided signal SD. The error signal CD is smoothed by the low-pass filter 3 to generate a control signal CC. The VC0 4 generates an output clock CK0 having an oscillation frequency which is controlled based on the voltage level of the control signal CC. The frequency divider 5 generates a divided signal SD by dividing the output clock CK0 at a predetermined dividing ratio M, thereby supplying the output thereof to the phase comparator 1.

When the entire circuit is a steady state of the operation, i.e., a synchronous state after the synchronization transfer period, the frequencies and phases of the reference clock CKR and the divided signal SD coincide with each other. Accordingly, the output clock CK0 supplied from the VCO 4 corresponds to a signal obtained by multiplication of the reference clock CKR by the dividing ratio M.

The synchronization transfer period mentioned above corresponds to a transient period required for transferring the phase lock loop into the steady state for synchronization and is determined by a sum of a pull-in period, which is referred to as a frequency synchronization period, and a lock-in period, which is referred to as a phase synchronization period. In order to reduce the synchronization transfer period. One method that has been suggested is to increase the loop constant constituting the gain of the phase comparator 1, the gain of the charge pump circuit 2, the time constant of the low-pass filter 3, and the gain of the VCO 4. However, the increase of the loop constant causes an increase in jitter representing momentary swings of the output clock CK0. In the synchronization transfer period of the first conventional phase lock loop , the pull-in period is extremely large as compared to the lock-in period and occupies a major part of the synchronization transfer period accordingly.

The first conventional phase lock loop as described above has a disadvantage that the increase of the loop constant required for reduction of a synchronization transfer period causes an increase in jitter.

FIG. 3 shows a second conventional phase lock loop in a block diagram, in which constituent elements similar to those in FIG. 1 are designated by common reference numerals and in which the synchronization transfer period thereof is determined solely by a phase synchronization period. The second conventional phase lock loop has, in addition to a phase comparator 1, a charge pump circuit 2 and a low-pass filter which are similar to those in the first conventional phase lock loop, a variable delay circuit 40 for generating a delayed signal TD obtained by delaying the reference clock CKR based on the control signal CC, the variable delay circuit 40 being, for example, one of constituent elements of the VC0 4 in FIG. 2A.

In operation, after the reference clock CKR is supplied, the system functions similarly to the first conventional phase lock loop and transfers into a steady state such that the delayed signal TD, which is the output from the variable delay circuit 40, has a desired and predetermined small phase shift relative to the phase of the reference clock CKR.

The phase lock loop of FIG. 3 includes no frequency divider, so that the reference clock CKR and the output delayed signal TD have the same frequency. As a result of this, the frequency synchronization period, i.e., the pull-in period is not necessary. Namely, the synchronization transfer period is determined solely by a phase synchronization period, i.e., a lock-in period and is extremely small. However, in the absence of the frequency divider, the use of the phase lock loop is limited to the case wherein the frequency of the desired output clock CKO is same as the frequency of the reference clock CKR.

SUMMARY OF THE INVENTION

In view of the foregoing, it is an object of the present invention to provide a phase lock loop, for use in a variety of applications, having a reduced synchronization transfer period and a low jitter output.

In accordance with the present invention, a phase lock loop is provided which comprises a control signal generating section, receiving a first and second input signals through a first and a second inputs thereof, respectively, to generate a control signal based on a phase difference between the first signal and the second signal, a variable delay circuit, including a plurality of cascaded variable delay gates each controlled by the control signal, a frequency divider, having an input connected to the output of the phase lock loop, for supplying a divided signal obtained by dividing the output of the variable delay circuit, a lock detecting section for detecting a phase difference between the first signal and the output of the variable delay circuit being smaller than a predetermined value to generate a lock detection signal, a first switching section for connecting the input of the variable delay circuit selectively to the output of one of the variable delay gates, responding to the lock detection signal, to form a loop for oscillation, or to the first input of the control signal generating section during absence of the lock detection signal, and a third switching section for connecting the second input of the control signal generating section selectively to the output of the variable delay circuit during the absence of the lock detection signal or to the output of the frequency divider responding to the lock detection signal.

The above and other objects, features and advantages of the present invention will be apparent from the following description.

DESCRIPTION OF THE PREFERRED EMBODIMENTS

Figure 1:
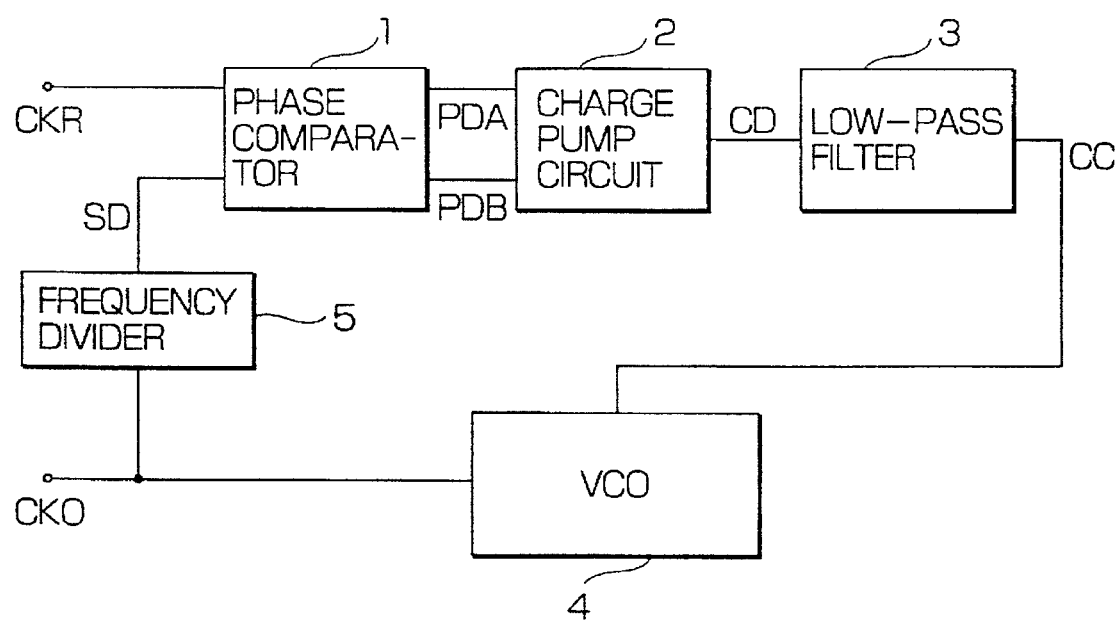
FIG. 1 is a block diagram showing a first conventional phase lock loop.

Now, the present invention will be described in more detail with reference to the accompanying drawings, in which similar constituent elements are designated by common reference characters and/or numerals.

Figure 4:
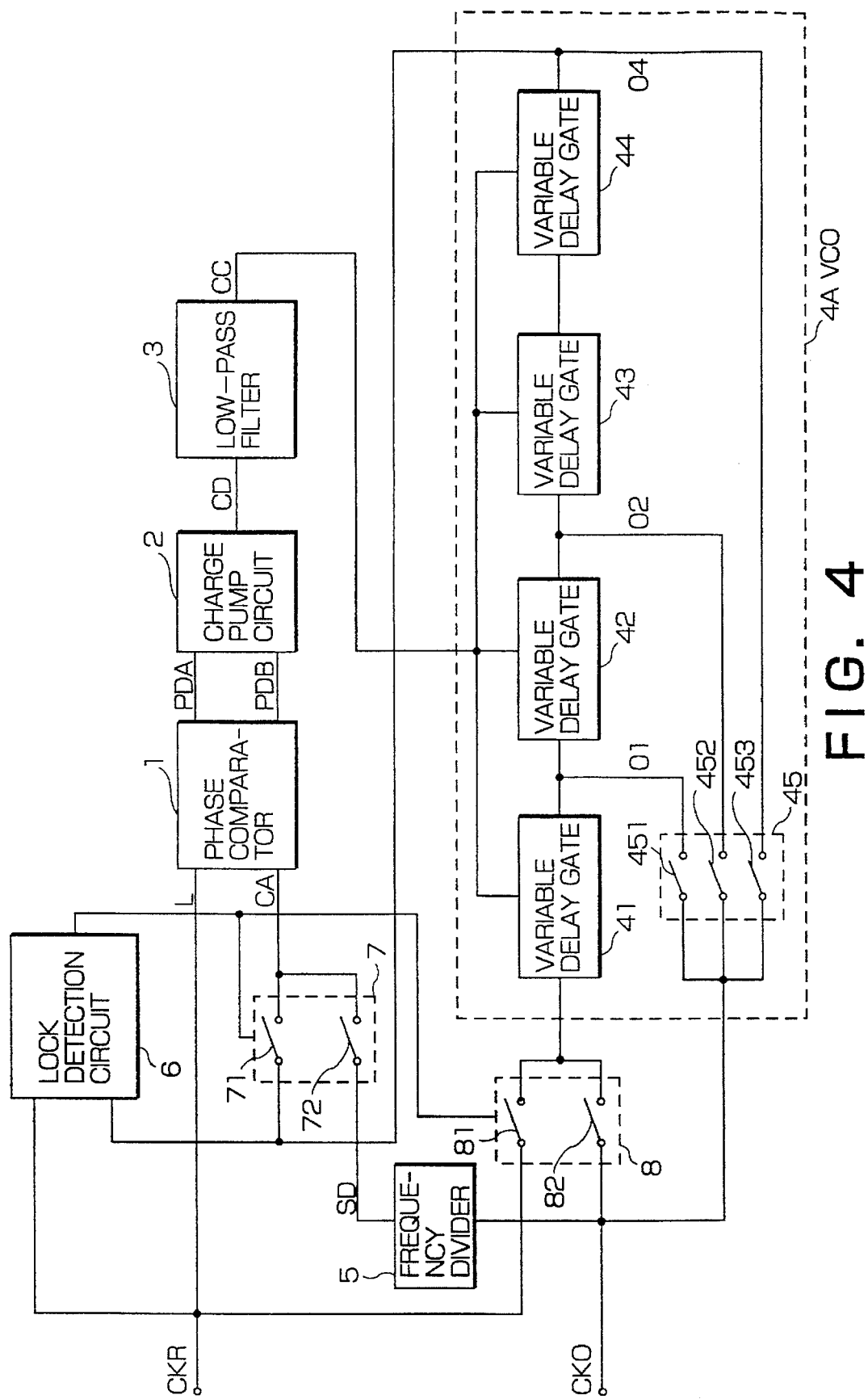
FIG. 4 is a block diagram showing a phase lock loop according to a first embodiment of the present invention.

Referring to FIG. 4, there is shown a phase lock loop according to a first embodiment of the present invention. The phase lock loop of the present embodiment includes, in addition to a phase comparator 1, a charge pump circuit 2, a low-pass filter 3 and a frequency divider 5 all similar to those described with reference to FIG. 1, a VCO 4A, a lock detection circuit 6 and combination switches (or change-over switches) 7 and 8.

Figure 5:
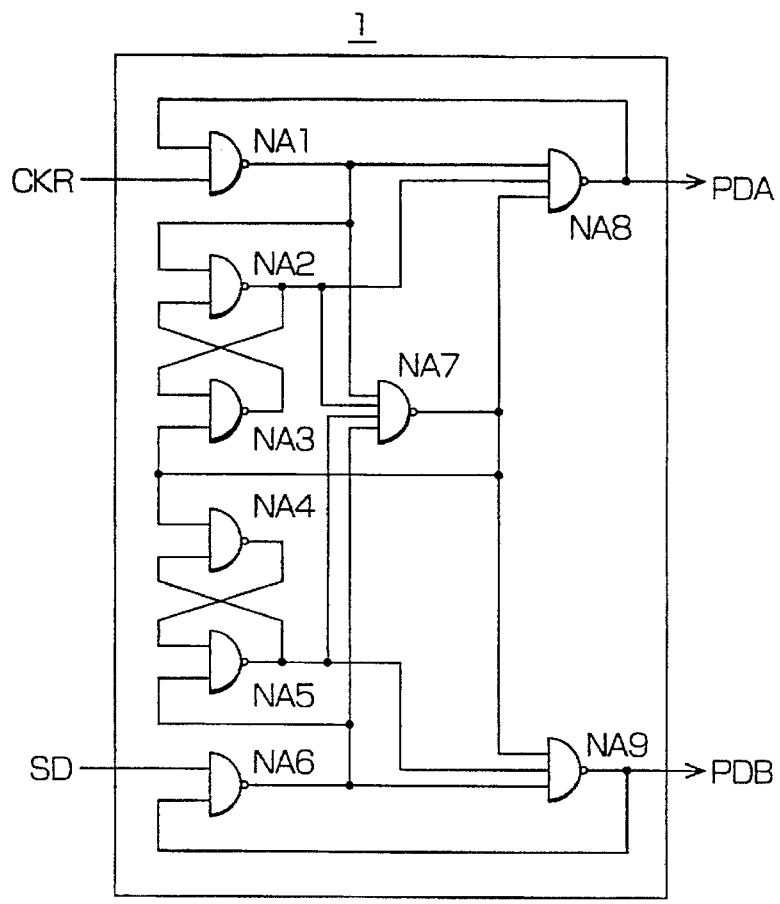
FIG. 5 is a circuit diagram showing the phase comparator in FIGS. 1 and 4.

Referring to FIG. 5, an example of the phase comparator 1 shown in FIG. 4 comprises NAND gates NA1 to NA9 and outputs phase difference signals PDA and pDB. The phase difference signals PDA and PDB are such that the pulse width of one of the phase difference signals pDA and pDB is determined by the phase difference between the reference clock CKR and the divided signal SD.

Figure 6:
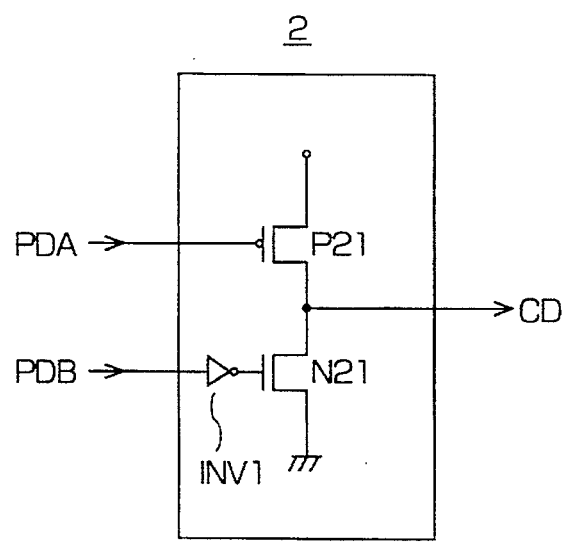
FIG. 6 is a circuit diagram showing the charge pump circuit in FIGS. 1 and 4.

Referring to FIG. 6, an example of the charge pump circuit 2 shown in FIG. 4 comprises an inverter INV1, a PMOS transistor p21 and an NMOS transistor N21, and generates an error signal CD having a voltage change proportional to the pulse width of the phase difference signals PDA and PDB. Namely, the output line of the charge pump circuit 2 is charged through the PMOS transistor P21 during a low level of both the phase difference signals PDA and PDB and discharged through the NMOS transistor N21 during a high level of the phase difference signals PDA and PDB. The charge pump circuit 2 converts the phase difference signal PD into an error signal CD having a voltage level based on the phase difference between the reference clock CKR and the divided signal SD.

Figure 7:
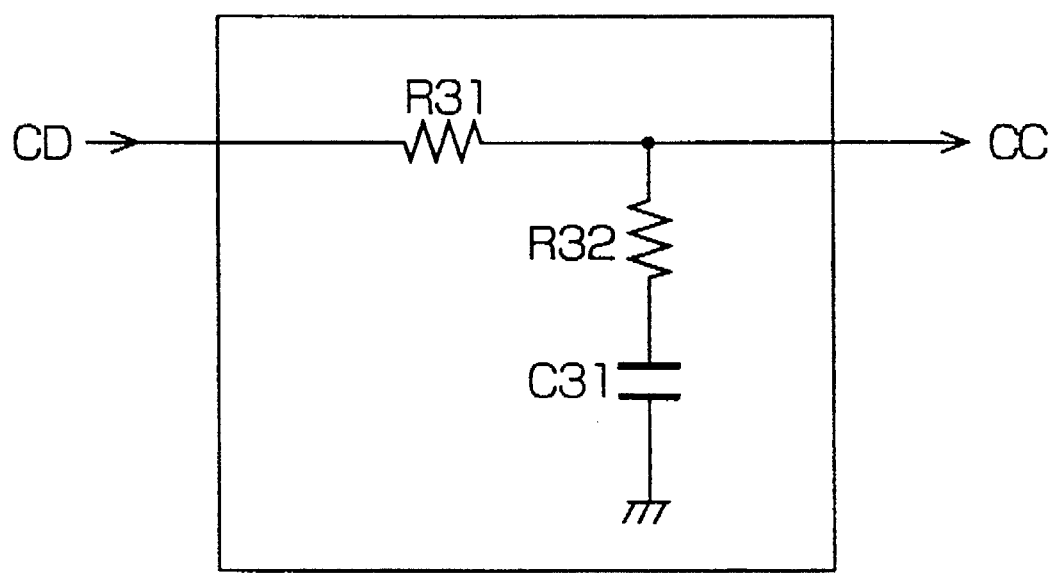
FIG. 7 is a circuit diagram of the low-pass filter shown in FIGS. 1 and 4.

Referring to FIG. 7, the low-pass filter shown in the FIG. 4 comprises resistors R31 and R32 and a capacitor C31, and generates a control signal CC by smoothing the error signal CD output from the charge pump circuit 2. The VCO 4A generates an output clock CKO having an oscillation frequency controlled by the control signal CC. The frequency divider 5 divides the output clock CKO by M to generate a signal having a frequency equal to that of the reference clock CKO.

Figure 8A:
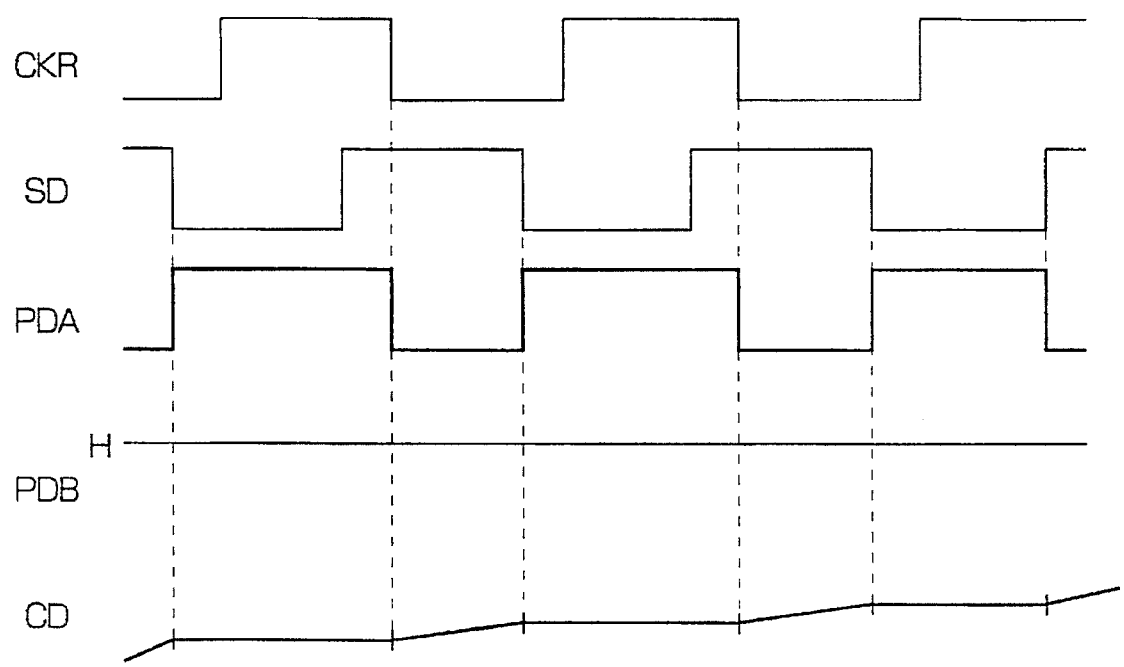
FIGS. 8A and 8B are timing charts each showing operation of the phase comparator and charge pump circuit in FIG. 4.
Figure 8B:
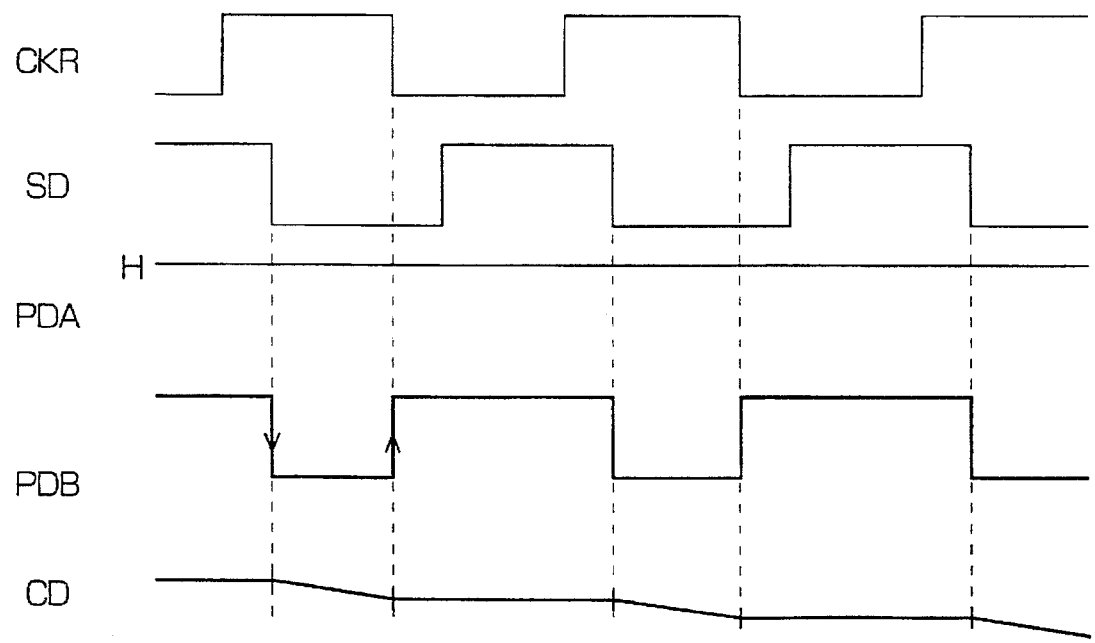

FIGS. 8A and 8B are timing charts for showing operation of the phase comparator 1 and the charge pump circuit 2. In FIG. 8A, the phase of the reference clock CKR leads with respect to the phase of the divided signal SD. The phase difference signal PDB remains at a high level in this situation, while the phase difference signal PDA falls responding to the fall of the reference clock CKR and rises responding to the subsequent fall of the divided signal SD. In the charge pump circuit of FIG. 6, a low level of the phase difference signal pDA charges the output line of the charge pump circuit 2 to raise the voltage level of the phase error signal CD while a high level of the phase difference signal PDA keeps the output level constant, provided that the phase difference signal PDB remains at a high level. The larger the phase difference between the reference clock CKR and the divided signal SD, the more the voltage level of the error signal CD rises.

On the other hand, if the phase of the divided signal SD leads with respect to the phase of the reference clock CKR, as shown in FIG. 8B, the phase difference signal PDA remains at a high level while the phase difference signal PDB falls responding the fall of the divided signal SD and rises responding to the subsequent fall of the reference clock CKR. The error signal CD falls during a low level of the phase difference signal PDB while remains constant during a high level of the phase difference signal PDB. The larger the phase difference between the divided signal SD and the reference clock CKR, the more the error signal CD falls.

In FIG. 4, the VCO 4A includes cascaded variable delay gates 41 to 44 similar to the variable delay gates D1 to DN in the conventional variable delay circuit 40, a combination switch 45 for switching by selecting one of the outputs 01, 02 and 04 from the variable delay circuits 41, 42 and 44 to supply the same as an output clock CKO.

The VCO 4A can be switched to function as a variable delay circuit during a first stage of a synchronization operation before a lock (a lock detection signal is generated) and functions as a typical VCO during a second stage of the synchronization operation after the lock. The lock detection circuit 6 detects a phase difference between the reference clock CKR and an output clock CKO supplied from the VCO 4A being smaller than a predetermined phase difference to thereby generate a lock detection signal L at the final state of a first stage of the synchronization operation and shift the phase delay circuit into the second stage. The combination switches 7 and 8 are controlled by the lock detection signal L to switch the phase lock loop into one of operation modes corresponding to the first and second stages.

Figure 2A:
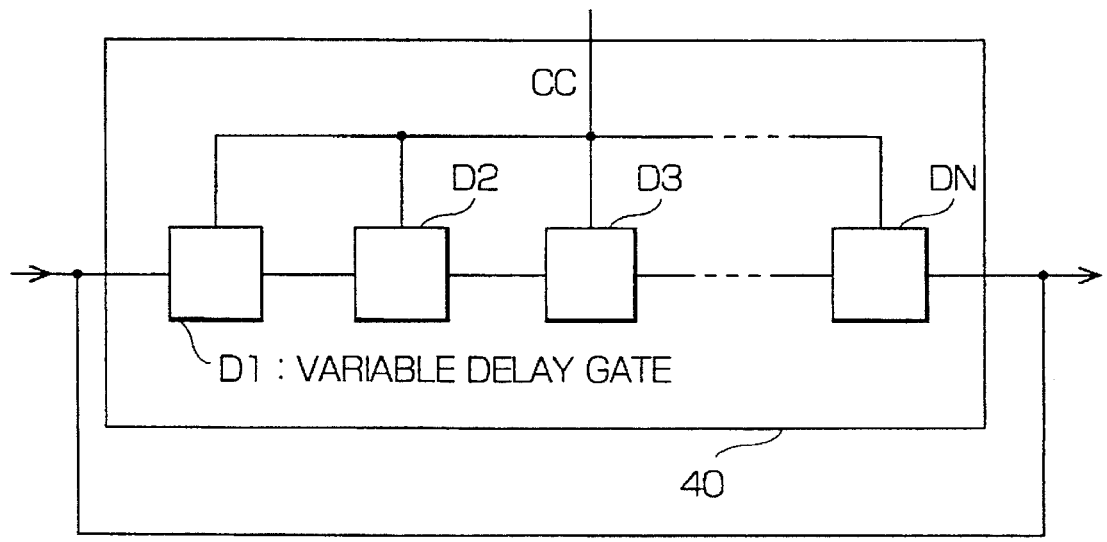
FIGS. 2A and 2B are circuit diagrams showing the VCO in FIG. 1 and one of the variable delay gates in FIGS. 2A and FIG. 4, respectively.
Figure 2B:
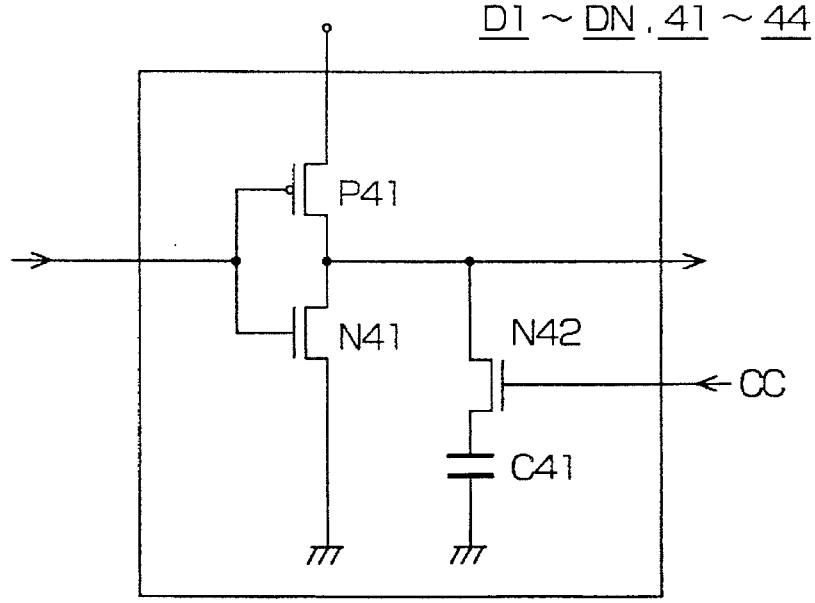
Figure 3:
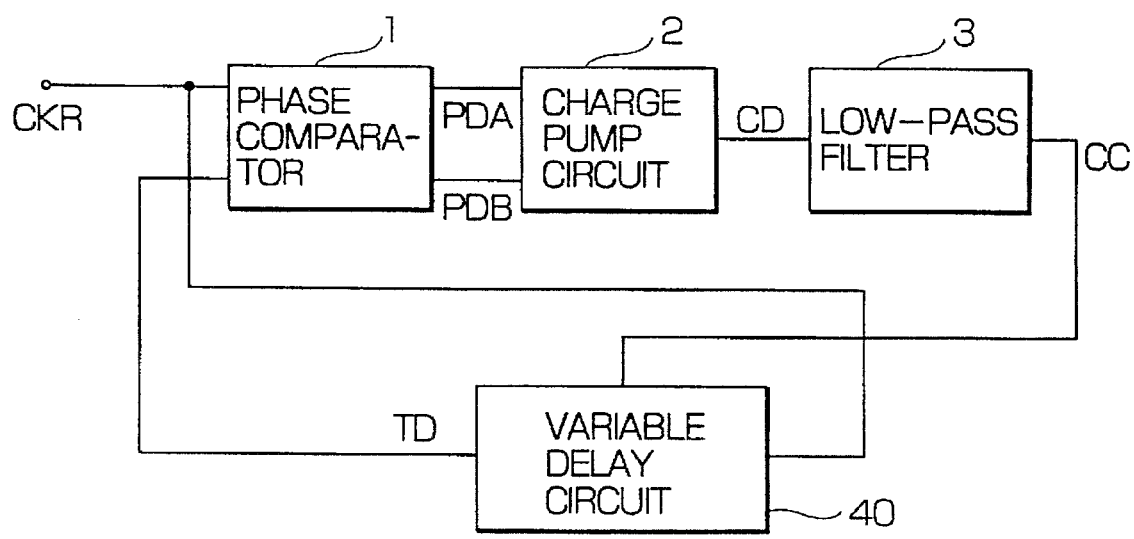
FIG. 3 is a block diagram showing a second conventional phase lock loop.

Referring back to FIG. 2B, each of the variable delay gates D1 to D4 is comprised of a CMOS inverter including a PMOS transistor P41 and an NMOS transistor N41, an NMOS transistor N42 having a drain connected to the output of the CMOS inverter, a source connected to one of the terminals of a capacitor C41, having the other of the terminal grounded, and a gate supplied with the control signal CC, wherein the variable delay gate varies the delay thereof by controlling the load capacitance of the CMOS inverter based on the voltage level of the control signal CC.

Now, operation of the phase lock loop according to the present embodiment will be described with reference to FIG. 4. First, just after supply of the electric power, after input of the reference clock or after pull-out from a once-reached synchronization, a first stage of the synchronization operation is conducted in which switch 71 of the combination switch 7 is ON, switch 81 of the combination switch 8 is ON, and remaining switches are OFF. In the first stage, the VCO 4A functions as a delay circuit having an input stage gate 41 and a final stage gate 44. The reference clock CKR is supplied to the input stage gate 41 as an input signal I and the output signal 04 from the final stage gate 44 is supplied to the phase comparator 1 as an input signal CA thereto to compare the same with the reference signal CKR.

When the phase lock loop shifts into a steady state for the synchronization operation in the first stage, the lock detection circuit 6 judges the steady state by detecting the small phase difference between the reference clock CKR and the input CA to generate a lock detection signal L. As a result, the phase lock loop shifts into a second stage to turn switch 72 ON, switch 82 0N, and one of switches 451, 452 and 453 of the combination switch 45 ON, with the remaining switches being OFF. The selection from the switches 451, 452 and 453 is determined by the desired dividing ratio M selected in the frequency divider 5. If the dividing ratio M is two, for example, then switch 452 is selected to be 0N. In general, the switch is selected such that the delay of the output of the VCO 4A in the initial state of the second stage is 1/M times the delay of the VCO 4A in the final state of the first stage. In the second stage, the VC0 4A functions as a typical voltage controlled oscillator, wherein the output clock CKO is supplied as an input signal I for the VC0 4A, and the divided signal SD from the frequency divider 5 is supplied to the phase comparator 1.

With the operation as described above, the voltage level of the control signal CC in the final state of the first stage is used as an initial value of the control signal CC after the system is switched into the second stage. In the second stage, the VCO 4A functions as an oscillator in which the input and the output of the delay circuit are connected in a loop. At the same time, by selecting one of the output delay signals: 01, 02 or 04 of the variable delay circuits 41, 42 or 44 by the combination switch 45, the initial delay time of the VC0 4A in the second stake can be selected. Eventually, the phase lock loop transfers into a final state of the synchronization operation in the second stage, similar to the first conventional phase lock loop. The transfer period into the steady state of the second stage is extremely small due to the initial value of the control signal CC being supplied in the initial state of the second stage.

In general, if an output clock CK0 is desired which has a frequency M times the frequency of the reference clock CKR, the dividing ratio of the frequency divider 5 is selected at M and the VCO 4A must have a configuration in which 1/M of the delay time in the first stage can be obtained, i.e., a first portion of the VC0 4A can generate a delay of 1/M of the total delay of the VC0 4A.

Figure 9:
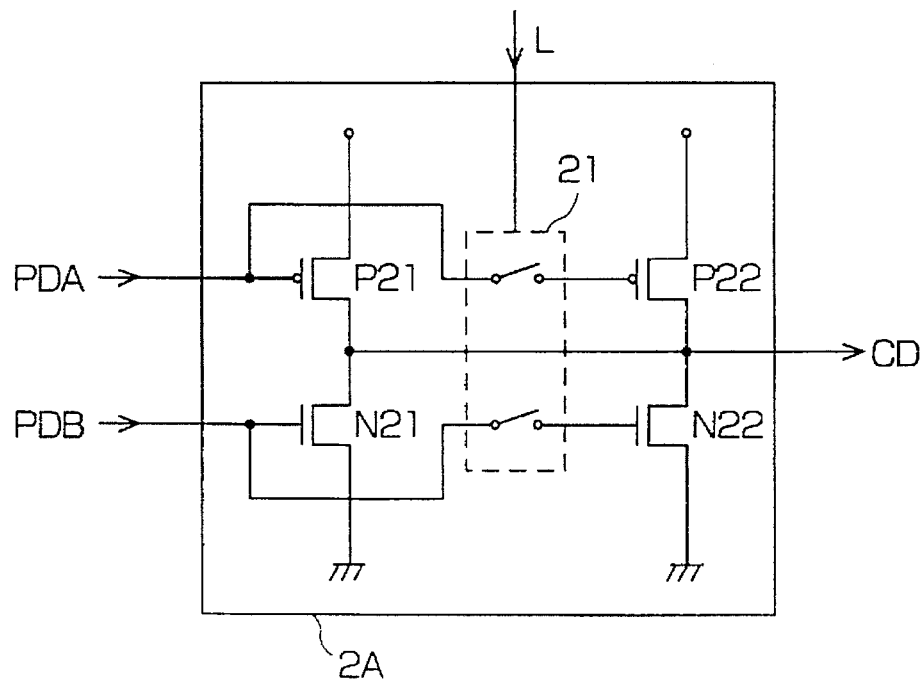
FIG. 9 is a circuit diagram of a charge pump circuit in a phase lock loop according to a second embodiment of the invention.

Referring to FIG. 9, there is shown a circuit diagram of a charge pump circuit 2A implementing a constituent element of a second embodiment of the present invention, which is similar to the phase lock loop of FIG. 4. The charge pump circuit 2A in the present embodiment differs from the charge pump circuit 2 in the first embodiment in that there are provided, in addition to a first inverter including transistors P21 and N21 similar to those in the first embodiment, a second inverter including transistors P22 and N22 connected in parallel to the first inverter, and a switch 21 for controlling the second inverter.

In operation, responding to a lock detection signal L, which is supplied when the phase lock loop is switched from a first stage into a second stage, the switch 21 is closed to connect the gates of the transistors P21 and P22 together and gates of the transistors N21 and N22 together. Accordingly, those transistors P21 and P22 and transistors N21 and N22 are respectively connected in parallel in the second stage, so that the equivalent transistor sizes of the charge pump circuit 2 become larger in the second stage to thereby increase the gain of the pulse width-voltage conversion characteristic in the charge pump circuit 2A. Hence, a high-speed synchronization operation is obtained in the second stage to attain both a further reduction in the synchronization transfer period and low jitter in the output clock.

Figure 10:
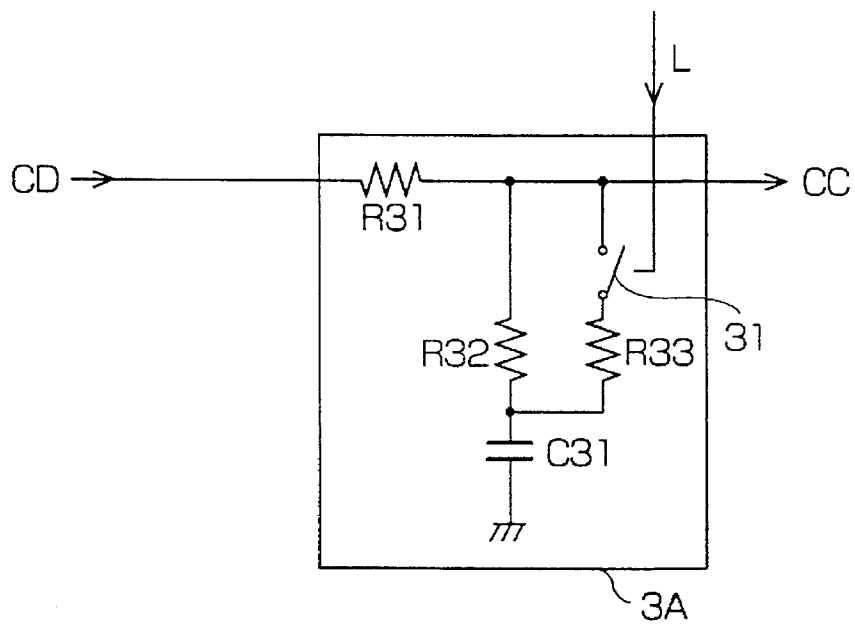
FIG. 10 is a circuit diagram of a low-pass filter in a phase lock loop according to a third embodiment of the present invention.

Referring to FIG. 10, there is shown a circuit diagram of a low-pass filter implementing a constituent element of a third embodiment of the present invention, which is similar to the phase lock loop of FIG. 4. The low-pass filter 3A in the present embodiment differs from the low-pass filter 3 in the first embodiment in that there are provided, in addition to a capacitor C31 and resistors R31 and R32 similar to those in the first embodiment, a resistor having one of the terminals connected to a node connecting the resistors R32 and the capacitor C31, and a switch responsive to a lock detection signal L, for connecting the other of the terminals of the resistor R33 and the output node supplying the control signal CC.

In operation, responding to a lock detection signal L, the switch 31 is closed to connect the resistors R32 and R33 in parallel, thereby reducing the time constant of the low-pass filter 3A in the second stage to obtain a quick response. Accordingly, a further high-speed lock-in operation can be obtained, similarly to the second embodiment, to attain both a further reduction in the synchronization transfer period and low jitter in the output clock.

Since above embodiments are only illustrative, the present invention is not limited to such embodiments and it will be obvious for those skilled in the art that various modifications or alterations can be easily made based on the above embodiments within the scope of the present invention.

What is claimed is:

1. A phase lock loop comprising:
   a control signal generating section, receiving an input signal and a first signal through first and second inputs of said control signal generating section, respectively, to generate a control signal based on a phase difference between said input signal and said first signal;
   a variable delay circuit, including a plurality of cascaded variable delay gates wherein each of said cascaded variable delay gates is controlled by the control signal;

a frequency divider for supplying a divided signal obtained by dividing the output of said phase lock loop;

a phase lock detecting section for detecting a phase difference between said input signal and the output of said variable delay circuit and for generating a phase lock detection signal when said phase difference between said input signal and the output of said variable delay circuit is smaller than a predetermined value;

a first switching section for connecting the input of said variable delay circuit to the first input of said control signal generating section in the absence of the phase lock detection signal, the output of said phase lock loop being connected to the output of one of said variable delay gates and for connecting the input of said variable delay circuit to the output of one of said variable delay gates to form a loop for oscillation when said phase lock detection signal is generated by said phase lock detecting section; and a second switching section for connecting the second input of said control signal generating section selectively to the output of said variable delay circuit in the absence of the lock detection signal and for connecting the second input of said control signal generating section to the output of said frequency divider when said phase lock detection signal is generated by said phase lock detecting section.

2. A phase lock loop as defined in claim 1 wherein said frequency divider divides the divided signal by a value M and wherein said plurality of cascaded variable delay gates include an integral number of M variable delay gates having a common delay characteristic with respect to the control signal.

3. A phase lock loop as defined in claim 1 wherein said control signal generating section includes a phase comparator for comparing phases of the input signal and the first signal to generate a phase difference signal having a pulse width based on the phase difference between the input signal and the first signal, and a charge pump circuit for charging or discharging the output line thereof during a time interval corresponding to the pulse width.

4. A phase lock loop as defined in claim 3 wherein said charge pump circuit includes a first PMOS transistor and a first NMOS transistor connected in series between a first potential line and a second potential line, wherein a node connecting said first PMOS transistor and said first NMOS transistor constitutes the output of the charge pump circuit.

5. A phase lock loop as defined in claim 4 wherein said charge pump circuit further includes a second PMOS transistor and a second NMOS transistors connected in parallel to said first PMOS transistor and said first NMOS transistor, respectively, and wherein the gates of said second PMOS and NMOS transistor are connected to the gates of said first PMOS and NMOS transistors, respectively, and wherein a node connecting said second PMOS transistor and said second NMOS transistor constitutes the output of said charge pump circuit when said phase lock detection signal is generated by said phase lock detecting section.

6. A phase lock loop as defined in claim 1 wherein said control signal generating section includes a low-pass filter at the output stage thereof.

7. A phase lock loop as defined in claim 6 wherein said low-pass filter has means for reducing the time constant of the low-pass filter when said phase lock detection signal is generated by said phase lock detection section.

8. A phase lock loop as defined in claim 1 wherein the output of one of said plurality of cascaded variable delay gates is selectively connected to the outuput of said phase lock loop by a third switching section.

\* \* \* \* \*